United States Patent [19]
Kawakita et al.

[11] Patent Number: 5,817,404
[45] Date of Patent: Oct. 6, 1998

[54] PRINTED CIRCUIT BOARD

[75] Inventors: Kouji Kawakita, Kyoto; Seiichi Nakatani, Osaka; Masahide Tsukamoto, Nara, all of Japan

[73] Assignee: Matsushita Electric Industrial Co., Ltd., Osaka, Japan

[21] Appl. No.: 585,508

[22] Filed: Jan. 16, 1996

[30] Foreign Application Priority Data

Jan. 20, 1995 [JP] Japan .................................. 7-006894
Jun. 8, 1995 [JP] Japan .................................. 7-142001

[51] Int. Cl.$^6$ ....................................................... B32B 3/00
[52] U.S. Cl. ........................... 428/209; 428/210; 428/901
[58] Field of Search ..................... 428/209, 901, 428/210

[56] References Cited

U.S. PATENT DOCUMENTS

| | | | |
|---|---|---|---|
| 4,897,301 | 1/1990 | Uno et al. | 428/901 |
| 5,117,069 | 5/1992 | Higgins, III | 428/901 |
| 5,316,831 | 5/1994 | Nakajima et al. | 428/210 |
| 5,346,750 | 9/1994 | Hatakeyama et al. | 428/901 |
| 5,350,621 | 9/1994 | Yuhas et al. | 428/901 |
| 5,362,551 | 11/1994 | Okamoto et al. | 428/210 |
| 5,481,795 | 1/1996 | Hatakeyama et al. | 428/901 |
| 5,484,647 | 1/1996 | Nakatani et al. | 428/901 |

FOREIGN PATENT DOCUMENTS

| | | |
|---|---|---|
| 0 568 930 | 11/1993 | European Pat. Off. . |
| 0 602 298 | 6/1994 | European Pat. Off. . |
| 2-058358 | 2/1990 | Japan . |
| 5-304-223 | 11/1993 | Japan . |
| 6-005747 | 1/1994 | Japan . |
| 6-005994 | 1/1994 | Japan . |
| 6-268345 | 9/1994 | Japan . |

*Primary Examiner*—Cathy F. Lam
*Attorney, Agent, or Firm*—Merchant, Gould, Smith, Edell, Welter & Schmidt, P.A.

[57] ABSTRACT

The present invention provides a printed circuit board in which electrode layers can electrically be connected by an inner-through-hole connection, the coefficient of thermal expansion of the board is equal to that of a semiconductor, high thermal conductivity can be obtained and wiring can be formed at a high density. A cover film is laminated on both surfaces of a resin impregnated fabric sheet, holes are formed by laser beams in the direction of the thickness of the sheet and cover film, an electrically conductive paste that contains the electrically conductive particles and a thermosetting resin is filled in the holes. The cover film is removed, a copper foil is placed on both sides of the sheet, and pressed and heated, and the resin component of the sheet and that of the electrically conductive paste are hardened. The copper foil is etched to form circuit patterns, and further etching removes the electrically conductive particles present at a surface layer portion so that an electrical insulating layer is thus formed.

15 Claims, 16 Drawing Sheets

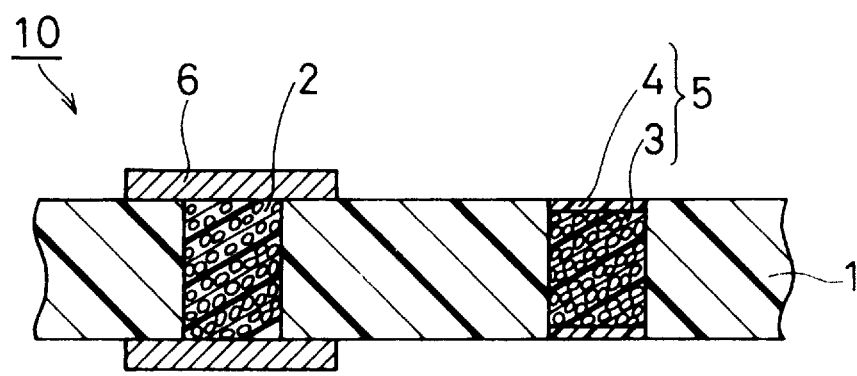
F I G. 1

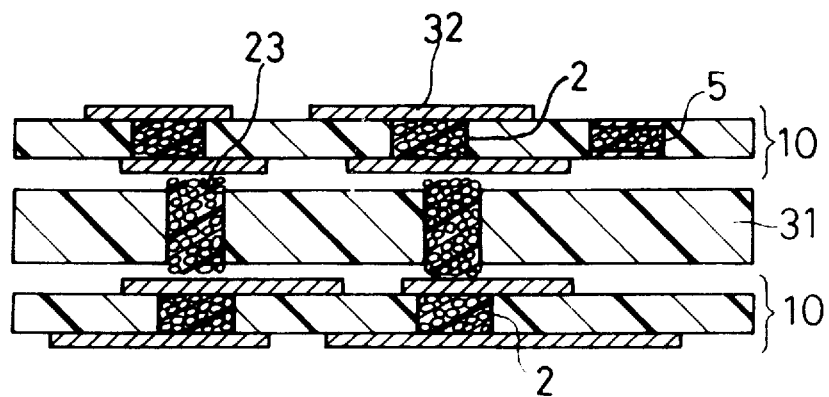
F I G. 5 (a)
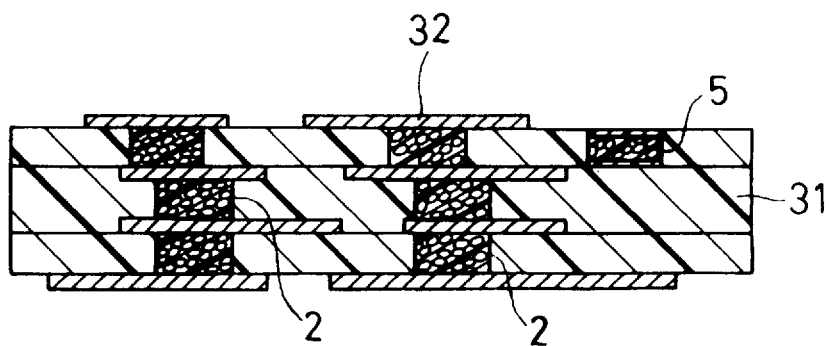
F I G. 5 (b)

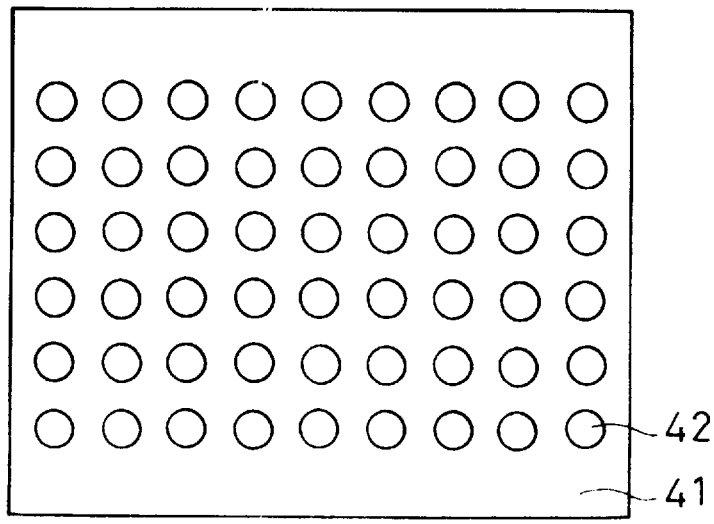
F I G. 6 (a)
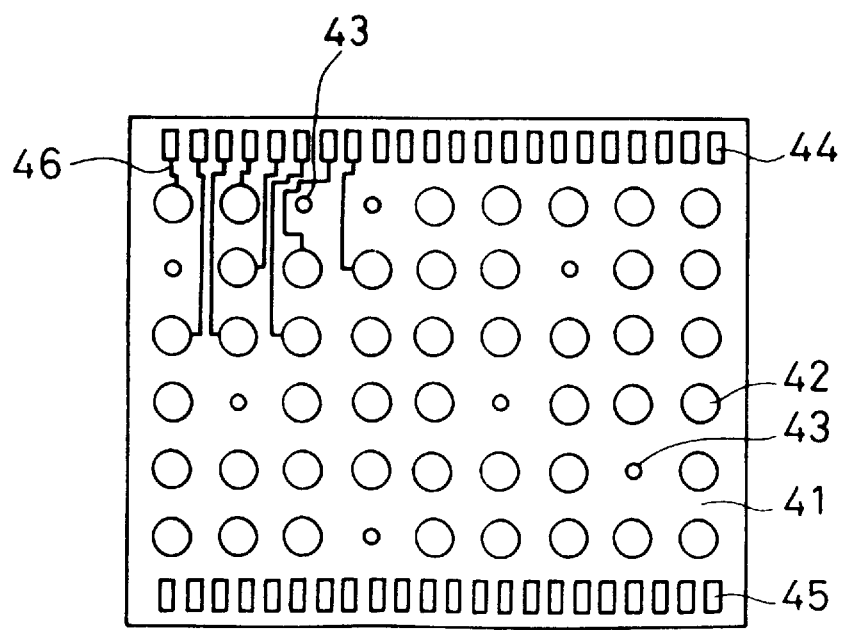
F I G. 6 (b)

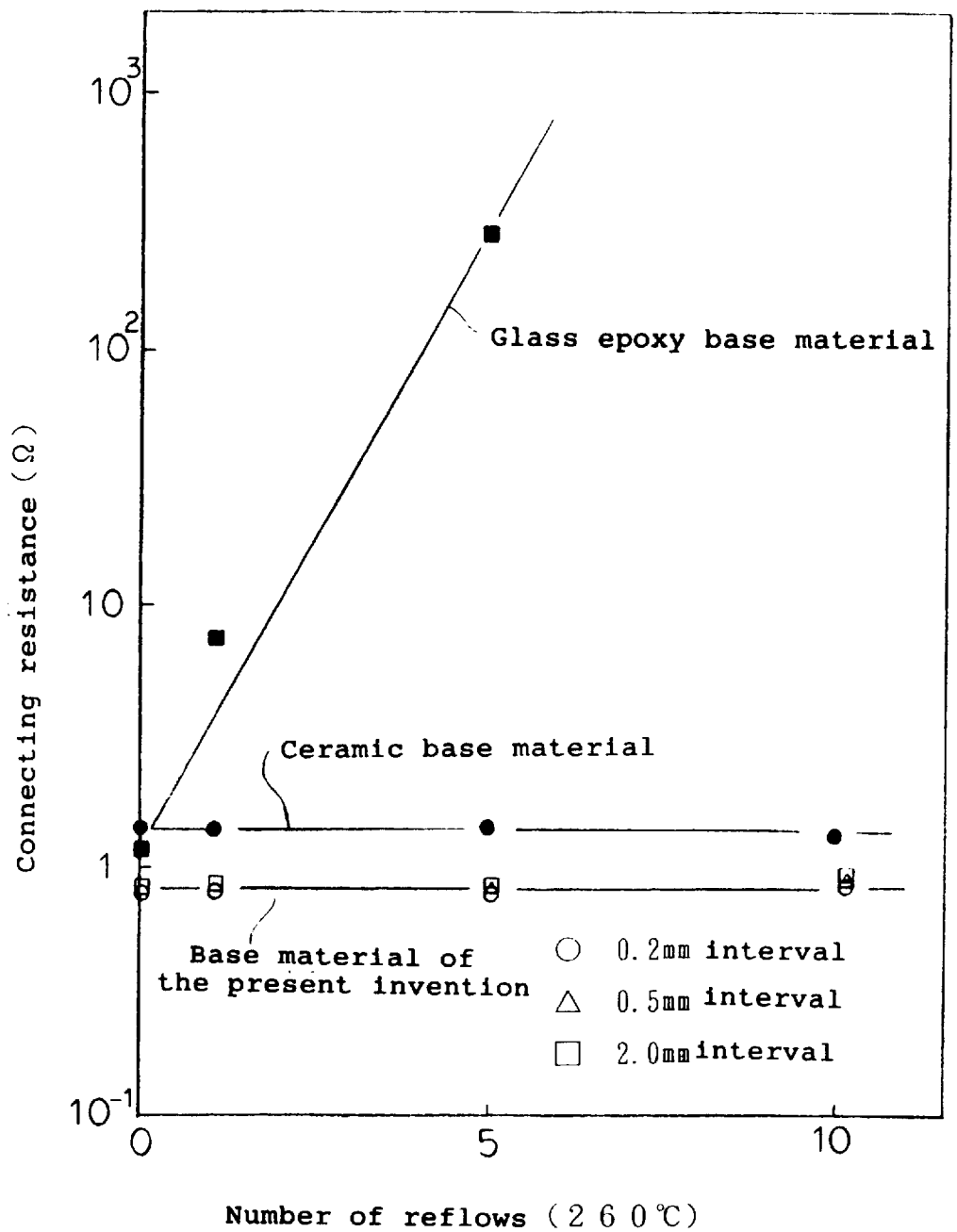
F I G. 7

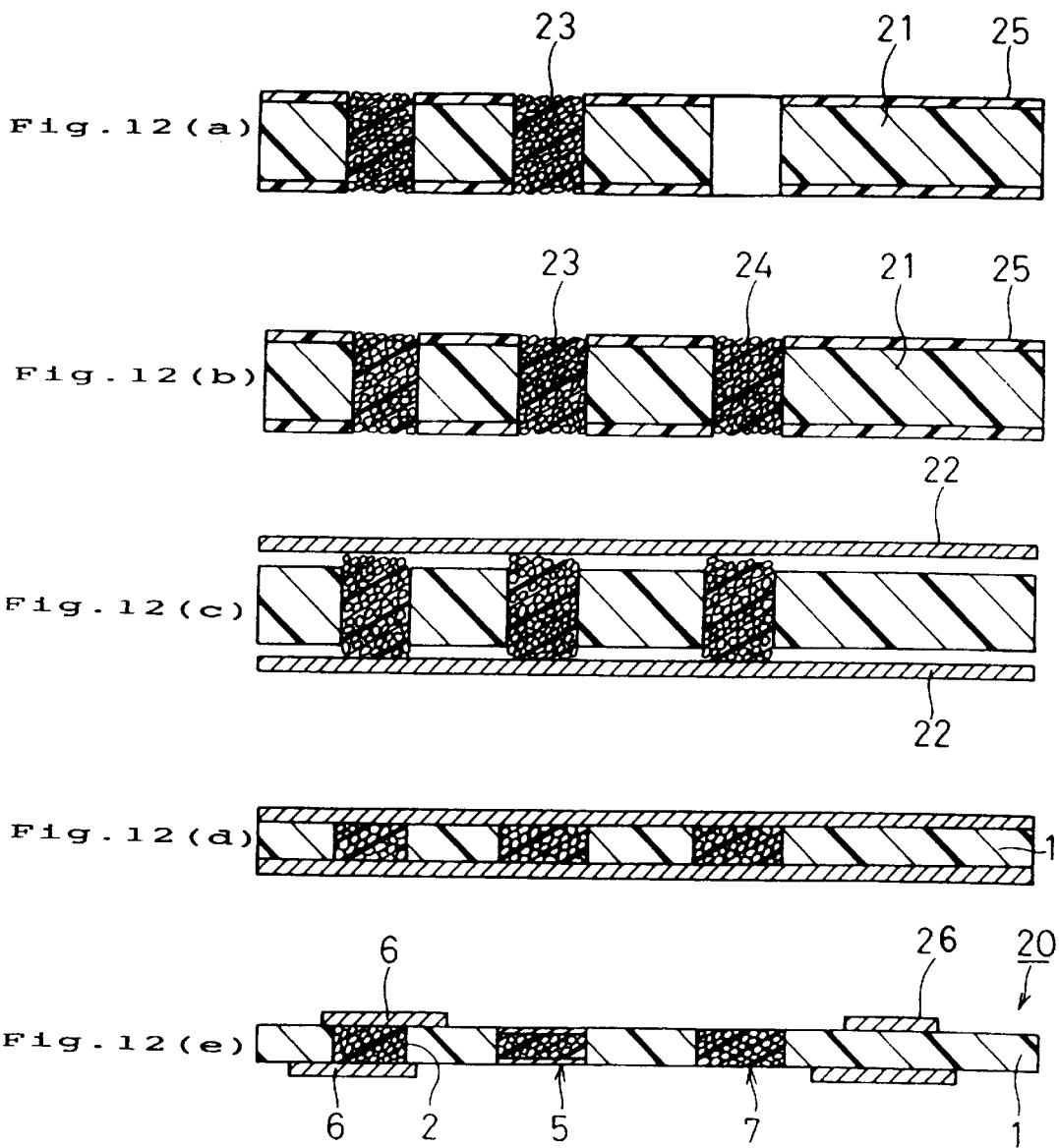

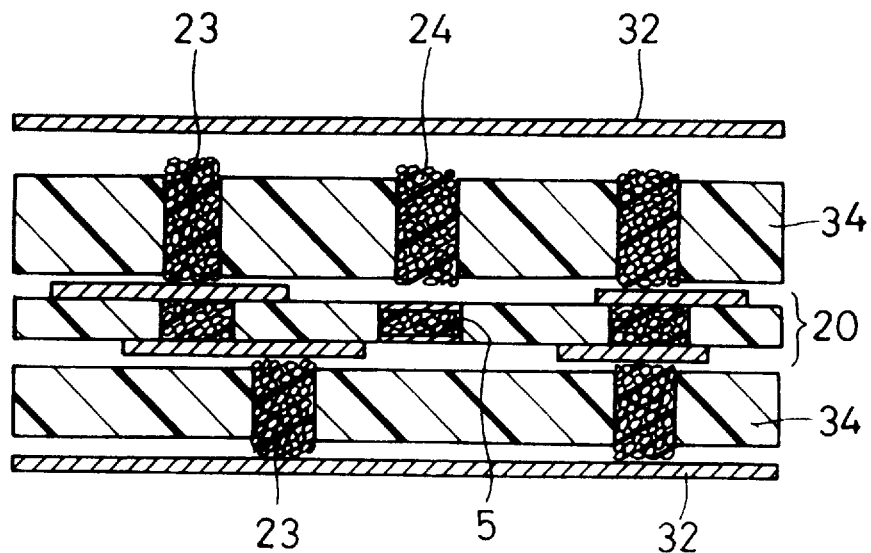
F I G. 1 3 (a)
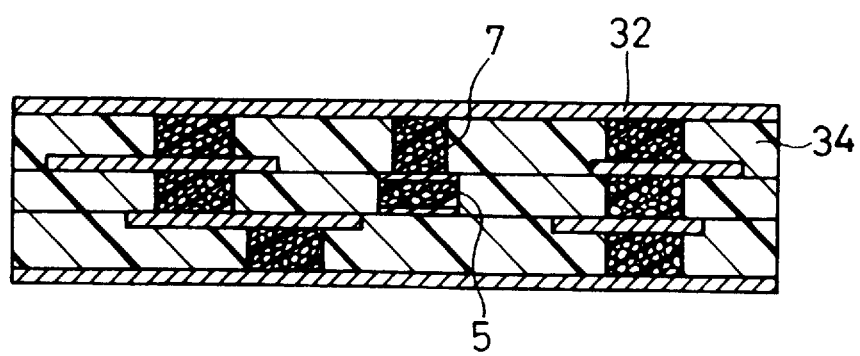
F I G. 1 3 (b)

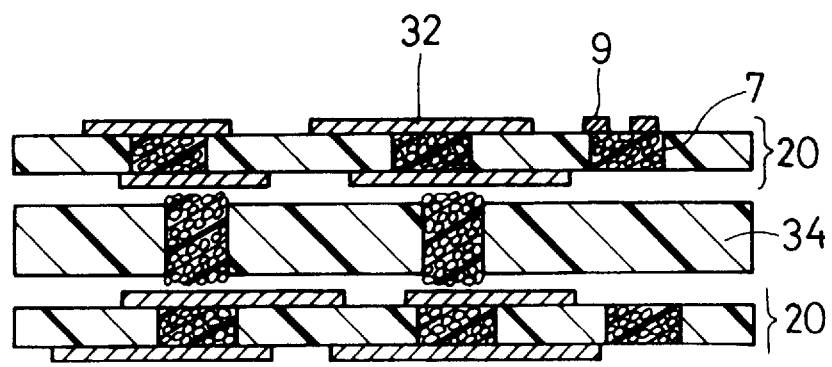
F I G. 1 4 (a)
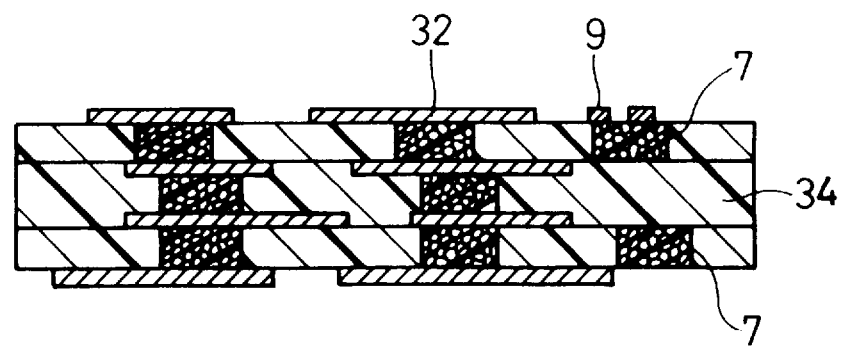
F I G. 1 4 (b)

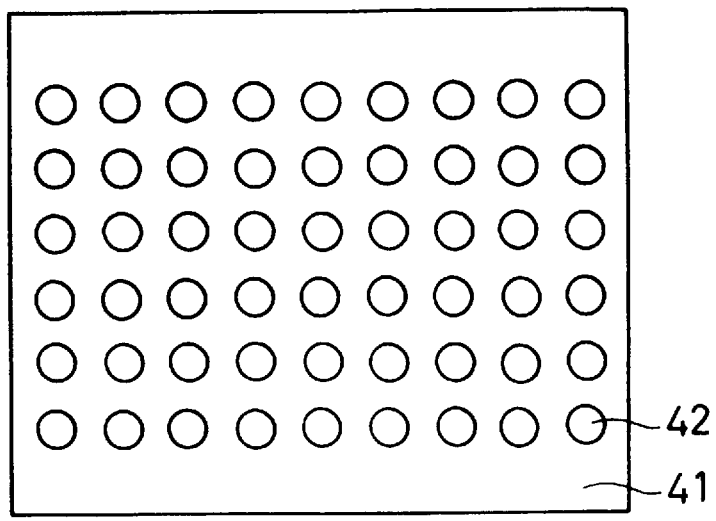
F I G. 1 5 (a)
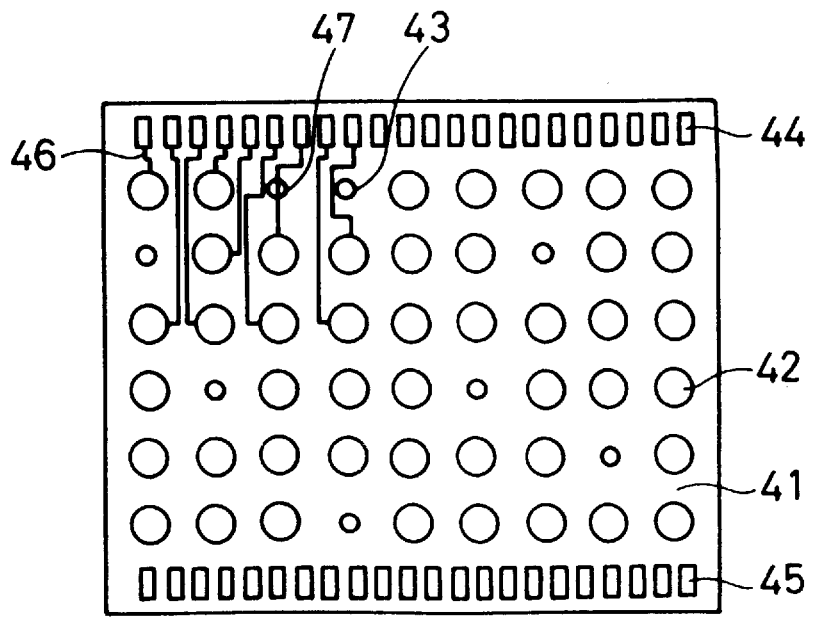
F I G. 1 5 (b)

PRINTED CIRCUIT BOARD

FIELD OF THE INVENTION

The present invention relates to a printed circuit board using a resin impregnated fabric sheet, and more particularly to double-sided and multilayer printed circuit boards for bare chip IC mounting that exhibit high thermal conductivity.

BACKGROUND OF THE INVENTION

Recently, a printed circuit board has required increased multilayer and density with the higher performance and smaller size of electronic equipment. By using an inner-through-hole connection for connecting ICs or parts at a minimum distance as a method for connecting layers of a board, the higher density can be obtained. According to the inner-through-hole connection, only the necessary layers can be connected, and the top layer of a board has no through hole and mounting properties are excellent. Japanese Laid-Open Patent No. 6-268345 (Japanese Patent Application No. 5-77840) has proposed a printed circuit board (double-sided and multilayer printed circuit boards) having the inner-through-hole connecting structure in which an organic non-woven fabric is impregnated with a thermosetting resin to form a sheet board material (which is hereinafter referred to as a resin impregnated fabric sheet), a through hole is formed on the resin impregnated fabric sheet by laser beams, electrically conductive paste is filled in the through hole, and heat and pressure are applied to the resin impregnated fabric sheet.

The printed circuit board can be formed by the simple steps described above, in which the connecting resin impregnated fabric sheet is used to connect layers by the inner-through-hole connection. In addition, such a printed circuit board is inexpensive. In the case where the printed circuit board is used as a board for mounting a semiconductor of a chip size, the semiconductor can be mounted stably because the coefficient of thermal expansion of the board in the direction of a plane is almost equal to that of the semiconductor. However, the printed circuit board which is formed by the connecting resin impregnated fabric sheet has low thermal conductivity. Therefore, there are problems when the printed circuit board is used as a board for mounting a semiconductor chip. Moreover, an electrode land restricts an area on the top layer of the board in which wiring is formed (for example, the wiring for an electric connection with the semiconductor chip), so that high density wiring is not achieved.

SUMMARY OF THE INVENTION

It is an object of the present invention to provide a printed circuit board (double-sided and multilayer printed circuit boards) and a method of manufacturing the same wherein electrode layers can be connected electrically by an inner-through-hole connection, the coefficient of thermal expansion of the board in the direction of a plane is equal to that of a semiconductor, thermal conductivity is high, and wiring can be formed at a high density.

In order to achieve this object, the present invention provides a printed circuit board, comprising a resin-impregnated fabric sheet, an electrically conductive portion having a first through hole formed in the direction of the thickness of the sheet, the first through hole being filled with a first resin composition that contains the electrically conductive particles to provide an electrical connection in the direction of the thickness of the sheet, and a thermally conductive (heat radiating) portion having a second through hole formed in the direction of the thickness of the sheet, the second through hole being filled with a second resin composition that contains the thermally conductive particles, wherein at least a surface layer portion of the second resin composition has electrical insulating properties. According to such a structure, heat radiation can be performed efficiently by the thermally conductive portion. Since an electrode land is not provided on the surface layer of the thermally conductive portion, wiring can be provided on the board surface area around the thermally conductive portion. Accordingly, it is possible to provide a printed circuit board in which electrode layers can be connected electrically by an inner-through-hole connection, the coefficient of thermal expansion of the board in the direction of a plane is equal to that of a semiconductor, thermal conductivity can be enhanced and the wiring can be formed at a high density.

In the printed circuit board, the thermally conductive particles contained in the second resin composition may be electrically conductive particles. Consequently, the same electrically conductive paste as the first resin composition can be filled simultaneously in the first and second through holes. In addition, the second resin composition can easily be formed on the thermally conductive portion by a process including etching.

Further, the thermally conductive particles contained in the second resin composition may be electrical insulating particles. Consequently, heat radiation can be performed efficiently in such a case since the surface layer of the thermally conductive portion has no thermal insulating property.

In the printed circuit board, a resin composition that contains the electrically conductive particles and a resin composition that contains the thermally conductive insulating (electrical insulating heat radiation) particles are separately filled in the second through hole. Consequently, the number of thermally conductive portions can be increased so that heat radiation can be performed efficiently. In addition, wiring can be provided in a board area around the thermally conductive portion of the first through hole having no electrode and on the thermally conductive portion of the second through hole having no electrode land. Accordingly, it is possible to implement a printed circuit board in which the electrode layers can be connected electrically by an inner-through-hole connection, the coefficient of thermal expansion of the board in the plane direction is equal to that of the semiconductor, thermal conductivity can be enhanced and the wiring can be formed at a higher density.

As a preferred example, the electrical insulating resin layer and the component resin of the resin composition are thermosetting resins. In this case, the printed circuit board has good heat resistance and can be resistant to solder and solder reflow.

As a preferred example, the electrical insulating resin layer, the component resin of the resin composition and the resin of the resin impregnated fabric sheet are epoxy resins. In this case, the integral bonding of the electrically conductive portion to the fabric sheet and that of the thermally conductive portion to the fabric sheet can be obtained.

As a preferred example, a metallic foil pattern having a portion that is bonded to the electrically conductive portion is formed on at least one of upper and lower faces of the resin impregnated fabric sheet. In this case, the printed circuit board in which a metallic foil pattern is an electric circuit can be provided.

As a preferred example of the structure, the electrically conductive particles are selected from the group consisting of Au, Ag, Cu, Al, Pd, Ni and alloys thereof. In this case, the conductivity of the electrically conductive portion can be enhanced.

As a preferred example of the structure, the thermally conductive insulating particles are selected from the group consisting of alumina particles, silica particles and magnesia particles. In this case, the electrical insulating properties of the thermally conductive portion can be suitably maintained.

As a preferred example of the structure, the fabric sheet is a nonwoven fabric of a heat resistant synthetic fiber or a paper impregnated with the thermosetting resin so that the resin impregnated fabric sheet is obtained. In this case, it is possible to provide a printed circuit board that is thin and has a high strength.

As an example of the structure, the fabric sheet is formed of a heat resistant synthetic fiber that is at least one of an aromatic polyamide fiber and a polyimide fiber. In this case, it is possible to provide a printed circuit board that is thin and has a good workability and a high strength.

According to the present invention, a first method for manufacturing a printed circuit board having an electrically conductive portion which is filled with a first resin composition that contains the electrically conductive particles in the direction of the thickness of a resin impregnated fabric sheet and a thermally conductive portion which is filled with a second resin composition that contains the thermally conductive particles and whose surface layer portion has electrical insulating properties, comprises the steps of;

A. laminating a cover film onto both surfaces of a resin impregnated fabric sheet, B. forming a plurality of through holes in the direction of the thickness of the sheet and cover film, C. filling the through holes with an electrically conductive paste that contains the electrically conductive particles and a thermosetting resin, D. removing the cover film, E. placing a metallic foil on both sides of the sheet, pressing and heating the sheet, and hardening the resin components of the sheet and those of the electrically conductive paste, and F. etching the metallic foil so as to remove a portion of the foil that blocks a first group of the through holes, forming the metallic foil into a predetermined circuit pattern, further etching to remove the electrically conductive particles present at a surface layer portion of the first group of through holes, so as to form an electrical insulating layer having a surface layer portion formed of the thermosetting resin.

Consequently, it is possible to manufacture efficiently and reasonably a printed circuit board in which the thermal conductivity can be enhanced and the wiring can be formed at a high density.

A second method for manufacturing a printed circuit board according to the present invention comprises the steps of laminating a cover film onto both surfaces of a resin impregnated fabric sheet, forming first and second through holes in the direction of the thickness of the sheet and cover film, filling the first through holes with an electrically conductive paste that contains the electrically conductive particles and a thermosetting resin and filling the second through holes with an electrical insulating paste that contains the thermally conductive insulating particles and the thermosetting resin, removing the cover film, placing a metallic foil on both sides of the sheet, pressing and heating the sheet, and hardening the resin components of the sheet, the electrically conductive paste, and the insulating paste, and etching the metallic foil so as to remove a portion of the foil that blocks the second through hole and forming the metallic foil into a predetermined circuit pattern. Consequently, it is possible to manufacture efficiently and reasonably a printed circuit board in which the thermal conductivity can be enhanced and the wiring can be formed at a high density.

A third method for manufacturing a printed circuit board according to the present invention comprises the steps of laminating a cover film onto both surfaces of a resin impregnated fabric sheet, forming first, second and third through holes in the direction of the thickness of the sheet and cover film, filling the first and second through holes with an electrically conductive paste that contains the electrically conductive particles and a thermosetting resin and filling the third through holes with an electrical insulating paste that contains the thermally conductive insulating particles and a thermosetting resin, removing the cover film, placing a metallic foil on both sides of the sheet, pressing and heating the sheet, hardening the resin components of the sheet, the electrically conductive paste, and the electrical insulating paste, and etching the metallic foil so as to remove portions of the foil that block the second and third through holes, forming the metallic foil into a predetermined circuit pattern, further etching to remove the electrically conductive particles present at a surface layer portion of the second through hole, so as to form an electrical insulating layer comprised of the thermosetting resin on the second through hole. Consequently, it is possible to manufacture efficiently and reasonably a printed circuit board in which the thermal conductivity can be enhanced and the wiring can be formed at a higher density.

According to the printed circuit board of the present invention, heat radiation can efficiently be performed by the thermally conductive portion having at least a surface layer insulated. Since the electrode land is not provided on the surface layer of the thermally conductive portion, the wiring can be formed on the board surface area around the thermally conductive portion. Accordingly, the electrode layers can be connected electrically by an inner-through-hole connection, and the coefficient of thermal expansion of the board in the direction of a plane is equal to that of the semiconductor. In addition, it is possible to provide a printed circuit board in which thermal conductivity can be enhanced and the wiring can be formed at a high density.

According to the first to third methods for manufacturing the printed circuit board according to the present invention, it is possible to manufacture efficiently and reasonably a printed circuit board in which the thermal conductivity of the thermally conductive portion can be enhanced and the wiring can be formed at a high density.

BRIEF DESCRIPTION OF THE DRAWINGS

FIG. 1 is a sectional view showing the structure of a double-sided printed circuit board for bare chip mounting according to an embodiment of the present invention, FIGS. 5A and 5B are sectional views showing the individual steps of manufacturing the multilayer printed circuit board according to an embodiment of the present invention, FIGS. 6A and 6B are views showing the solder surface and semiconductor chip mounting surface of the double-sided printed circuit board for bare chip mounting according to an embodiment of the present invention, FIG. 7 is a graph showing the change in resistance obtained by the reflow test of the double-sided printed circuit board having a semiconductor chip mounted thereon according to Example 1 of the present invention, FIGS. 12A to 12E are sectional views showing the individual steps of manufacturing the double-sided printed circuit board for bare chip mounting shown in FIG. 10, FIGS. 13A and 13B are sectional views showing the individual steps of repeating the steps of manufacturing the double-sided printed circuit board shown in FIG. 12 so as to manufacture a multilayer printed circuit board, FIGS. 14A and 14B are sectional views showing the individual steps of manufacturing a multilayer printed circuit board according to an embodiment of the present invention, FIGS. 15A and 15B are views showing the solder surface and semiconductor chip mounting surface of the double-sided printed circuit board for bare chip mounting according to an embodiment of the present invention.

DETAILED DESCRIPTION OF THE INVENTION

As a first example of the present invention, resin double-sided and multilayer printed circuit boards for directly mounting a semiconductor can be obtained in the following manner. For example, aromatic polyamide (aramid) fibers are impregnated with an epoxy resin to form a resin impregnated fabric sheet such as an aramid-epoxy base material for which coefficient of thermal expansion of the board in the direction of a plane is almost equal to that of a semiconductor. The resin impregnated fabric sheet thus formed is used as a board body. The layers of the board are connected by inner-through-holes in which high density can be obtained. In order to enhance thermal conductivity, a thermally conductive portion is formed. The thermally conductive portion has almost the same structure as that of the inner-through-holes, and does not contribute to the connection of the layers of the board. Thus, the semiconductor can directly be mounted. As a second example, aromatic polyamide (aramid) fibers are impregnated with an epoxy resin to form a resin impregnated fabric sheet such as an aramid-epoxy base material for which the coefficient of thermal expansion of the board in the direction of a plane is almost equal to that of a semiconductor. The resin impregnated fabric sheet thus formed is used as a board body. The layers of the board are connected by inner-through-holes in which high density can be obtained. In order to enhance thermal conductivity, a thermally conductive portion is formed. The thermally conductive portion has a structure in which the electrically conductive particles in the inner-through-holes are replaced with electrical insulating particles. Thus, it is possible to obtain the resin double-sided printed circuit board and the multilayer printed circuit board on which a semiconductor can be mounted directly. In a third example, the structures described in Examples 1 and 2 are used.

A double-sided printed circuit board (hereinafter referred to as a double board) and a multilayer printed circuit board (hereinafter referred to as a multilayer board) for bare chip mounting according to an embodiment of the present invention will be described below with reference to the drawings.

Figure 2:
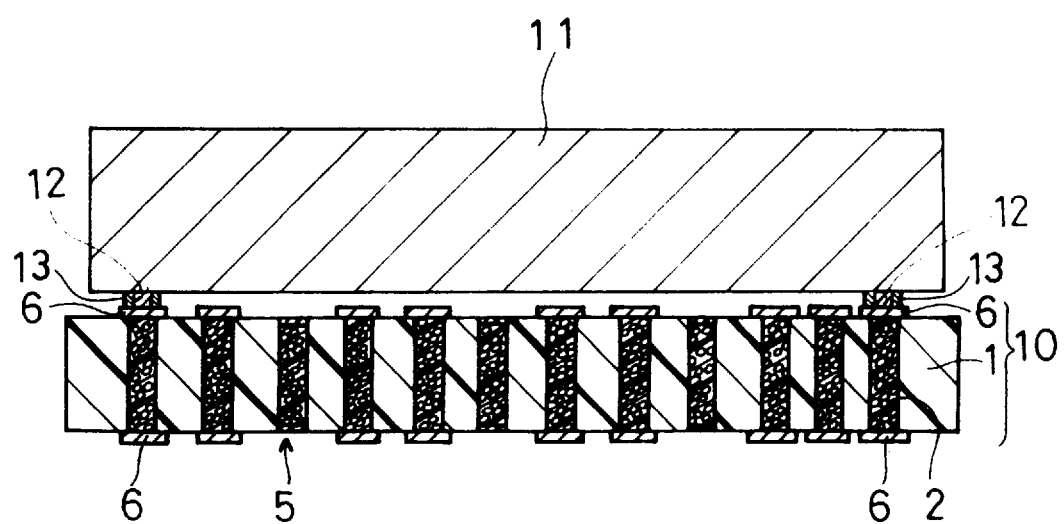
FIG. 2 is a sectional view showing the structure in which a semiconductor chip is mounted on the double-sided printed circuit board for bare chip mounting shown in FIG. 1, FIGS. 3A to 3D are sectional views showing the individual steps of manufacturing the double-sided printed circuit board for bare chip mounting shown in FIG. 1, FIGS. 4A and 4B are sectional views showing the individual steps of repeating the steps of manufacturing the double-sided printed circuit board shown in FIG. 3 so as to manufacture a multilayer printed circuit board.
Figure 3:
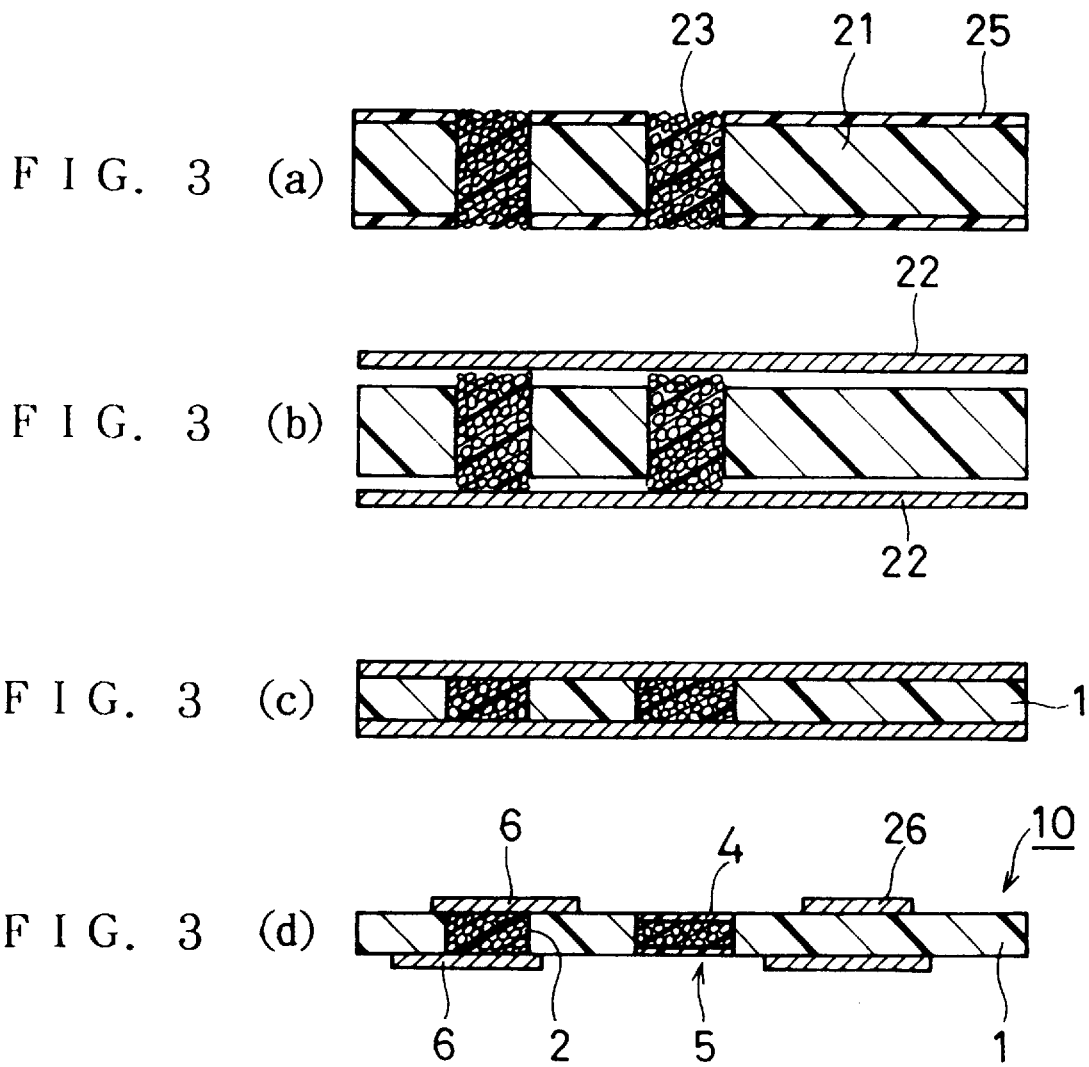

FIG. 1 is a sectional view showing the structure of a double board for bare chip mounting according to an embodiment of the present invention. A double board 10 comprises an electrically conductive portion 2 and a thermally conductive portion 5. The electrically conductive portion 2 is formed as follows. More specifically, a through hole is formed in a first area of a resin impregnated fabric sheet 1. Electrically conductive resin compositions are filled in the through hole. Electrically conductive particles 3 are scattered and contained in a thermosetting resin to form the electrically conductive resin compositions. The thermally conductive portion 5 is formed as follows. More specifically, a through hole is formed in a second area on the sheet 1. The electrically conductive resin compositions are filled in the inner layer of the through hole. An electrical insulating layer 4 is formed in a surface layer portion (an opening portion). An inner-through-hole is formed by the electrically conductive portion 2 and a copper foil 6 is provided on the surface thereof. Thus, electrode layers provided on the both sides of the board are electrically connected. Examples of the electrically conductive resin compositions are copper powder, epoxy resins and electrically conductive paste blended with an epoxy resin hardening agent. The double board 10 in which the resin impregnated fabric sheet 1 is used as a board body has a coefficient of thermal expansion which is almost equal to that of the semiconductor. In addition, internal heat is radiated from the electrically conductive portion 2 and the thermally conductive portion 5. Consequently, the printed circuit board has high thermal conductivity. FIG. 2 is a sectional view showing the double board for bare chip mounting shown in FIG. 1 on which a semiconductor chip is mounted. A semiconductor chip 11 is electrically connected to the double board 10 through an Au bump 12 and an electrically conductive material 13. The Au bump 12 is formed on the copper foil 6 and the semiconductor chip 11. The electrically conductive material 13 is provided around the Au bump 12 and is composed of Ag—Pd.

FIGS. 3A to 3D are sectional views showing the individual steps of manufacturing the double board 10. In FIG.

3A, a prepreg is indicated at 21. A resin film 25 such as polyethylene terephthalate is adhered to both sides of the resin impregnated fabric sheet material. Through-holes are formed in the direction of the entire thickness. In general, a drill and laser beams are used for forming the through holes. It is preferred that the laser beams are used for forming the through holes, because the through holes are formed at a fine pitch and shaving are not scattered. The through hole thus formed is filled with an electrically conductive paste 23. Various methods such as gravure, roll-pushing and pressure reducing filling can be employed as a method for filling the electrically conductive paste 23 in the through holes.

FIG. 3B shows the state in which a film 25 is removed from FIG. 3A and the sheet is held between copper foils 22.

FIG. 3C shows the state in which heat and pressure have already been applied. The prepreg 21 is compressed and has a smaller thickness. In addition, the resin is hardened (the resin impregnated fabric sheet 1). The electrically conductive paste 23 is compressed and the metal filling density is increased. In this state, the electrically conductive paste 23 serves to connect electrically the upper and lower sides of the resin impregnated fabric sheet 1.

FIG. 3D shows the state in which the copper foil 22 on the surface is etched to form a wiring pattern. The electrode layers are electrically connected by an inner-through-hole connection by means of the copper foil 6 provided on the electrically conductive portion 2 and the surface layer thereof. After a wiring pattern is formed, etching is continuously performed. Consequently, the copper powder of the electrically conductive paste 23 which is exposed to the opening portion is removed and an electrical insulating layer 4 comprised of an epoxy resin is formed in the through hole in which the copper foil 22 covering the opening portion is removed. Thus, the thermally conductive portion 5 is formed. For example, wet etching using ferric chloride as an etchant is employed. A copper foil 26 may be formed in a portion in which the electrically conductive portion 2 of the resin impregnated fabric sheet 1 is not present. This is advantageous to the production of the multilayer board. Ordinarily, the printed board is coated with a solder resist, characters or symbols are printed, and holes for inserted parts are formed. However, those steps are omitted because they are not essential.

FIGS. 4A and 4B show steps of repeating the method for forming the double board shown in FIGS. 3A to 3D so as to manufacture a multilayer board. FIG. 4A shows the state in which a resin impregnated fabric sheet material having through holes is provided on both sides (upper and lower faces) of the double board 10 which acts as a core, an electrically conductive paste is filled in the through hole, and a copper foil 32 is provided on the outer side of the through hole filled with the electrically conductive paste. In this state, when heat and pressure are applied from the upper and lower faces, a multilayer board shown in FIG. 4B is obtained. More specifically, an inner-through-hole connection is obtained by the in-situ method. The copper foil on the upper and lower faces are processed to form a pattern so that a four-layer printed board can completely be fabricated. It is possible to fabricate a multilayer board having more layers by repeating the steps described above.

FIG. 5 shows another method for forming a multilayer board which is different from the foregoing. In FIG. 5A, the prepreg 31 which has a through hole filled with the electrically conductive paste 23 and to which heat and pressure are not applied is held between the two double boards 10. A copper foil is indicated at 32. In this state, heat and pressure are applied so that a four-layer printed board shown in FIG. 5B can be obtained. A plurality of double boards are prepared. A laminated base material which has the through hole filled with the electrically conductive paste 23 and to which heat and pressure are not applied is held between the double boards, and the heat and pressure are applied thereto. Consequently, a multilayer board having more layers can be obtained.

FIG. 6A is a view showing the solder surface of the double board (multilayer board) for bare chip mounting according to an embodiment of the present invention. A number of copper foil patterns 42 are present on the surface of a resin impregnated fabric sheet 41. FIG. 6B is a view showing the semiconductor chip (IC) mounting surface of the double board (multilayer) board for bare chip mounting according to an embodiment of the present invention, in which a copper foil pattern (copper land) 42 which is present on the surface of the resin impregnated fabric sheet 41 and an IC pad 44 for through IC mounting are connected by wiring 46. The copper foil (copper land) is not present in a thermally conductive portion 43 (which has the same structure as that of the thermally conductive portion 5), i.e. a portion in which an electrically conductive paste is filled in a through hole, and the metal powder in the electrically conductive paste of the through hole opening portion is removed so that an electrical insulating layer is formed. For this reason, it is possible to use more of the space around the thermally conductive portion 43. Accordingly, the wiring can be formed at a high density in the board area around the thermally conductive portion 43. The wiring is actually provided on the IC pad 45, which is omitted for convenience of explanation.

Figure 10:
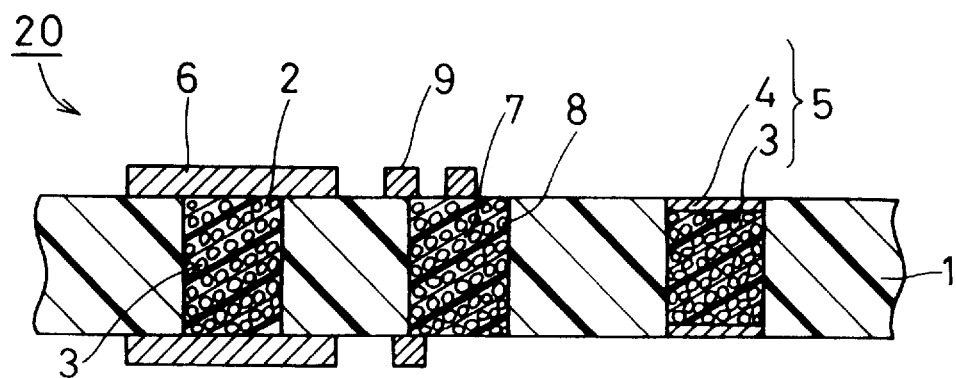
FIG. 10 is a sectional view showing the structure of a double-sided printed circuit board for bare chip mounting according to an embodiment of the present invention.

FIG. 10 is a sectional view showing the structure of a double board for bare chip mounting according to an embodiment of the present invention. A thermally conductive portion 7 is further provided on the double board 10 shown in FIG. 1 so that a double board 20 for bare chip mounting is formed. A through hole is formed in a third area of a resin impregnated fabric sheet 1. An electrical insulating resin composition in which electrical insulating particles 8 are scattered and contained in a thermosetting resin is filled in the through hole. Consequently, the thermally conductive portion 7 is formed. A copper foil 9 for wiring can be formed on the thermally conductive portion 7. Examples of the electrical insulating resin composition are alumina powder, epoxy resins and a paste blended with an epoxy resin hardening agent. According to the double board 20 using the resin impregnated fabric sheet 1 as a board body, the coefficient of thermal expansion of the board in the direction of a plane is almost equal to that of a semiconductor, and the internal heat is radiated by an electrically conductive portion 2 and thermally conductive portions 5 and 7. Consequently, a printed circuit board having high thermal conductivity can be obtained.

Figure 11:
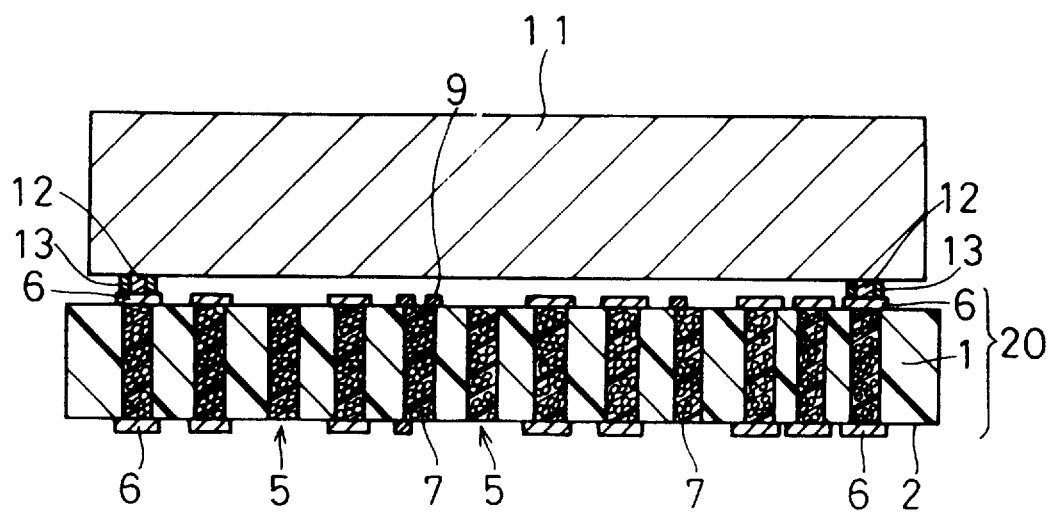
FIG. 11 is a sectional view showing the double-sided printed circuit board for bare chip mounting shown in FIG. 10 on which a semiconductor chip is mounted.

FIG. 11 is a sectional view in which a semiconductor chip is mounted on the double board for bare chip mounting shown in FIG. 10. A semiconductor chip 11 and a double board 20 are electrically connected by an Au bump 12 formed on a copper foil 6 and the semiconductor chip 11, and an electrically conductive material 13 composed of Ag—Pd.

FIGS. 12A to 12E are sectional views showing the individual steps of manufacturing the double board 20. In FIG. 12, the same reference numbers as in FIG. 3 designate the same or corresponding portions. In FIG. 12A, through holes are formed on a prepreg 21 by laser beams. An electrically conductive paste 23 is filled in the through holes by gravure, roll pushing, pressure reducing filling and the like.

As shown in FIG. 12B, an electrical insulating paste 24 is filled by gravure, roll pushing, pressure reducing filling and the like, in the residual through holes in which the electrically conductive paste 23 is not filled during the previous step.

FIG. 12C shows the state in which a film 25 is removed in the condition shown in FIG. 12B and a copper foil 22 is provided on both sides.

FIG. 12D shows the state in which heat and pressure has already been applied. The prepreg is compressed to have a smaller thickness, and a resin is hardened (a resin impregnated fabric sheet 1). The electrically conductive paste 23 and the electrical insulating paste 24 are compressed. The metal filling density of the electrically conductive paste 23 is increased. In this state, the electrically conductive paste 23 electrically connects the upper and lower faces of the resin impregnated fabric sheet 1.

FIG. 12E shows the state in which the copper foil 22 provided on the surface is etched to form a wiring pattern. Electrode layers are electrically connected by an inner-through-hole connection by means of an electrically conductive portion 2 and a copper foil 6 provided on the surface layer thereof. The compressed electrical insulating paste 24 functions as a thermally conductive portion 7. After a wiring pattern is formed, etching is continued. Consequently, in the through hole in which the copper foil 22 covering the opening portion is removed, the copper powder in the electrically conductive paste 23 which is exposed to the opening portion is removed so that an electrical insulating layer 4 comprised of an epoxy resin is formed as a thermally conductive portion 5. For example, wet etching is employed in which ferric chloride is used as an etchant. The copper foil 26 may be formed in a portion in which the electrically conductive portion 2 of the resin impregnated fabric sheet 1 is not present. This is very advantageous to the production of a multi-layer board. A copper foil for wiring can further be formed on an electrical insulating portion 7 comprised of the electrical insulating paste 24. Ordinarily, the printed board is coated with a solder resist, characters or symbols are printed, and holes for inserted parts are formed. However, those steps are omitted because they are not essential.

FIGS. 13A and 13B show the individual steps of repeating the steps of forming the double board shown in FIGS. 12A to 12C so as to manufacture a multilayer board. FIG. 13A shows the state in which the double board 20 acts as a core, a prepreg 34, in which the electrically conductive paste 23 is filled in the predetermined through holes and the electrical insulating paste 24 is filled in other through holes is provided on the upper and lower faces of the board 20, and a copper foil 32 is provided on the outer sides. In this state, when heat and pressure are applied from the upper and lower faces, a multilayer printed board shown in FIG. 13B is obtained. If the copper foil on the upper and lower faces are processed to form a pattern, a four-layer printed board can be fabricated completely. It is possible to fabricate a multilayer printed board having more layers by repeating the steps described above.

FIG. 14 shows another method for forming a multilayer printed board which is different from the foregoing. In FIG. 14A, the prepreg 32 which is filled with the electrically conductive paste and the electrical insulating paste and to which heat and pressure have not been applied is held between the two double boards 20. In this state, heat and pressure are applied so that a four-layer printed board shown in FIG. 14B can be obtained. To provide a multilayer board having more layers, a plurality of double boards are prepared, a laminated base material which has the through hole filled with the electrically conductive paste 23 and to which heat and pressure have not been applied is held between the double boards, and the heat and pressure are applied thereto. Consequently, a multilayer board having more layers can be obtained.

FIG. 15A is a view showing the solder surface of the double board (multilayer board) for bare chip mounting according to an embodiment of the present invention. A number of copper foil patterns 42 are present on the surface of a resin impregnated fabric sheet 41. FIG. 15B is a view showing the semiconductor chip (IC) mounting surface of the double board (multilayer board) for bare chip mounting according to an embodiment of the present invention, in which a copper foil pattern (copper land) 42 that is present on the surface of the resin impregnated fabric sheet 41 and an IC pad 44 for through IC mounting are connected by wiring 46. The copper foil pattern (copper land) is not present in a thermally conductive portion 43 (which has the same structure as that of the thermally conductive portion 5), i.e. a portion in which an electrically conductive paste is filled in a through hole, and the metal powder in the electrically conductive paste of the through hole opening portion is removed so that an electrical insulating layer is formed. For this reason, it is possible to use more of the space around the thermally conductive portion 43. Accordingly, the wiring can be formed at a high density in the board area around the thermally conductive portion 43. In contrast to the thermally conductive portion 43, the degree of insulation is extremely high in a thermally conductive portion 47 (which has the same structure as that of the thermally conductive portion 7), i.e., a portion in which the electrical insulating paste is filled in the through holes. For this reason, wiring can be formed directly on the thermally conductive portion 47. Accordingly, the wiring can be formed at a very high density in the board area including the thermally conductive portion 47 and the peripheral areas thereof. The wiring is actually provided on the IC pad 45 which is omitted for convenience of explanation.

Embodiments of the present invention will further be described in detail.

(Example 1)

An aramid-epoxy sheet (TA-01 manufactured by Teijin Limited) having a thickness of 200 μm is used as a prepreg. A polyethylene terephthalate film having a thickness of 20 μm is laminated as a cover film onto one of the sides of the prepreg with an adhesive. A through hole having a diameter of 0.15 mm is formed at regular intervals of 0.2 to 2 mm by means of carbon dioxide laser beams.

The following materials are filled in the through holes by the screen printing method. As a paste for through hole filling, spherical copper particles 85% by weight, a bisphenol A-type epoxy resin (EPICOAT 828 manufactured by Yuka Shell Epoxy Co., Ltd.) 3% by weight and a glycidylester based epoxy resin (YD-171 manufactured by Tohto Kasei Co., Ltd.) 9% by weight as resin compositions, and an amine adduct hardening agent (MY-24 manufactured by Ajinomoto Co., Inc.) 3% by weight as a hardening agent are kneaded by a triple roll.

The polyethylene terephthalate film is removed from the prepreg in which the paste is filled. Then, three prepregs are aligned and stacked to make a layered product. A copper foil having a thickness of 18 μm is laminated on the outer side of the prepreg on the upper and lower layers of the layered product, and heated and pressed at a temperature of 180° C.

and a pressure of 50 kg/cm² for 60 min by means of a heat press to form a double-sided copper-clad plate.

The copper foil of the double-sided copper-clad plate is etched to obtain a double board having a structure shown in FIGS. 1 and 2, which includes an inner-through-hole connecting portion (an electrically conductive portion) and a thermally conductive portion. The inner-through-hole connecting portion has a structure in which a wiring pattern and an electrode pattern having a diameter of 0.2 mm are formed on inner-through-holes. The thermally conductive portion has only the inner-through-holes.

An Au bump is formed on the electrode of a semiconductor device by the known wire bonding method. An adhesive which contains Ag—Pd as an electrically conductive material is applied onto the top portion of the bump. Thus, the bump is bonded to an electrode pattern formed on the double board by the flip chip method in which the surface of the semiconductor device is overturned, and is hardened and molded by a resin for mounting (see FIG. 2). The double board to which the semiconductor is mounted is subjected to a reflow test at a maximum temperature of 260° C. for 10 sec. FIG. 7 shows the change in electrical resistance, which includes the connection of the board to the semiconductor. According to a conventional glass epoxy board on which through holes are formed at regular intervals of 2 mm, the coefficient of thermal expansion of the semiconductor is different from that of the board so that the resistance is increased at the junction of the semiconductor and the board. Consequently, a disconnection is caused by the tenth time. According to the board of the present embodiment in which the coefficient of thermal expansion of the board in the direction of a plane is close to that of the semiconductor, no change in resistance caused by the number of reflows is observed.

Figure 8:
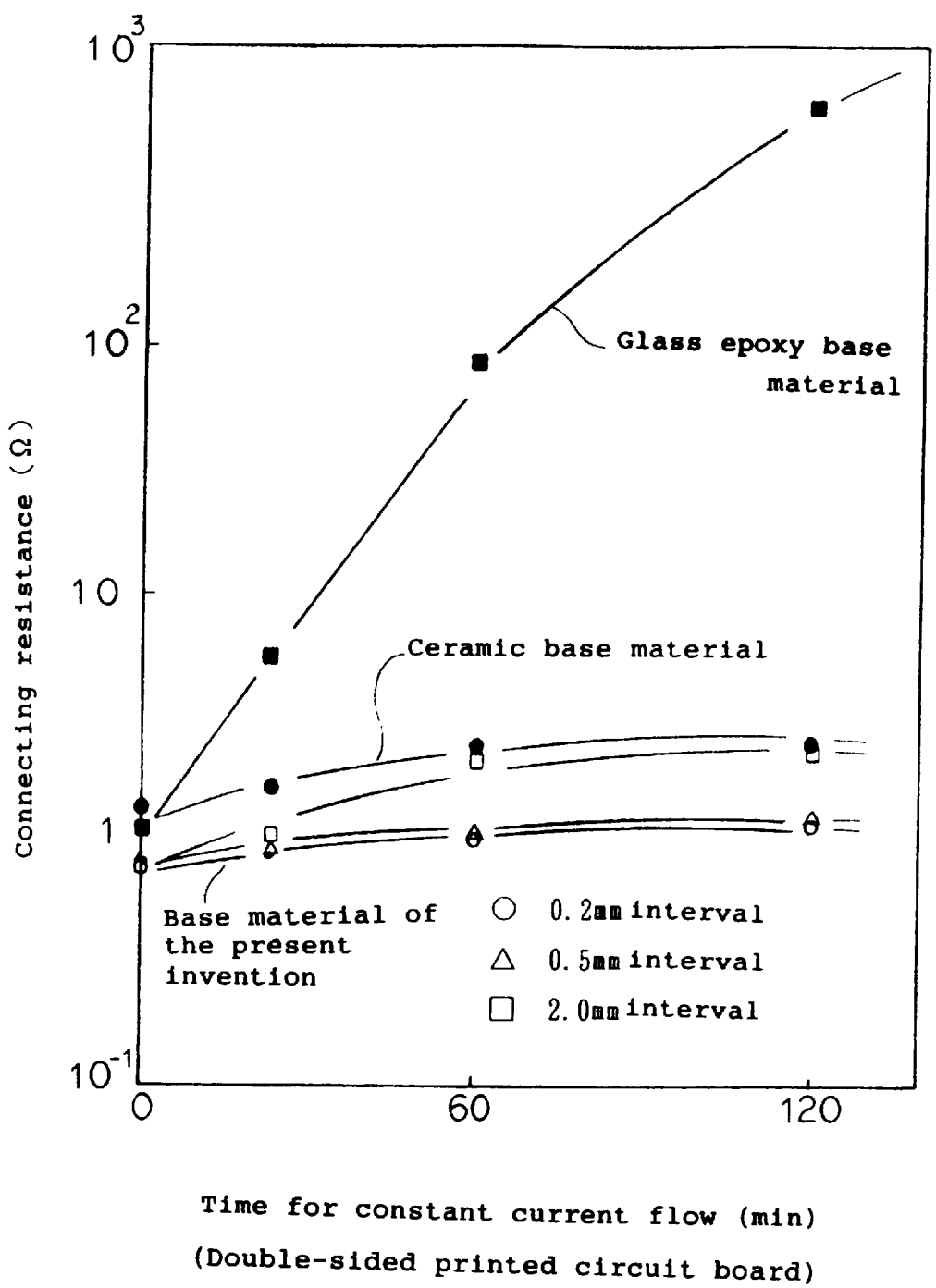
FIG. 8 is a graph showing the change in resistance obtained by sending a constant current to the semiconductor chip mounted on the double-sided printed circuit board so as to generate heat according to Example 1 of the present invention.

FIG. 8 shows the change of a resistance which includes the connection of the board to the semiconductor wherein a resistor is formed in a semiconductor chip, a constant current is sent to the chip through the board of the present embodiment, and the heat of 1W is continuously generated. The resistance of a glass epoxy board having a small heat conductivity is increased. According to the board of the present embodiment, the resistance is changed depending on the number of inner-through-holes. Practically, the change in resistance is not considered if the spacing is less than 2 mm. In particular, if the spacing is less than 0.5 mm, no change in resistance is observed.

(Example 2)

In the same manner as in Example 1, an aramid-epoxy sheet (TA-01 manufactured by Teijin Limited) is used as a prepreg. A polyethylene terephthalate film having a thickness of 20 μm is laminated onto one of the sides of the prepreg with an adhesive. A through hole having a diameter of 0.15 mm is formed at regular intervals of 0.2 to 2 mm shown in FIG. 6 by means of carbon dioxide laser beams.

The following materials are filled in the through holes by the screen printing method. As a paste for through hole filling, spherical copper particles 85% by weight, a bisphenol A-type epoxy resin (EPICOAT 828 manufactured by Yuka Shell Epoxy Co., Ltd.) 3% by weight and a glycidylester based epoxy resin (YD-171 manufactured by Tohto Kasei Co., Ltd.) 9% by weight as resin compositions, and an amine adduct hardening agent (MY-24 manufactured by Ajinomoto Co., Inc.) 3% by weight as a hardening agent are kneaded by a triple roll.

A polyethylene terephthalate film is removed from the prepreg in which the paste is filled. Then, a copper foil having a thickness of 18 μm is laminated on the upper and lower faces of the prepreg, and heated and pressed at a temperature of 180° C. and a pressure of 50 kg/cm² for 60 min by means of a heat press to form a double-sided copper-clad plate.

The copper foil of the double-sided copper-clad plate is etched to obtain a double board having a structure which includes an inner-through-hole connecting portion (an electrically conductive portion) and a thermally conductive portion. The inner-through-hole connecting portion has a structure in which a wiring pattern and an electrode pattern having a diameter of 0.2 mm are formed on inner-through-holes. The thermally conductive portion has only the inner-through-hole.

A prepreg in which an electrically conductive paste is filled is aligned and laminated on the upper and lower faces of the double board to make a layered product. A copper foil having a thickness of 18 μm is laminated on the outer side of the layered product, and heated and pressed at a temperature of 180° C. and a pressure of 50 kg/cm² for 60 min by means of a heat press.

Figure 4:
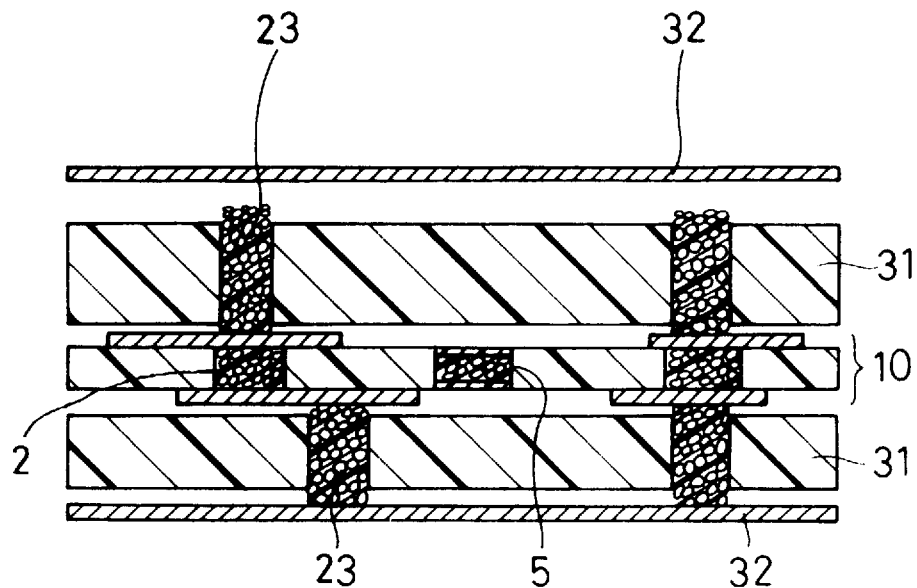
Figure 4:
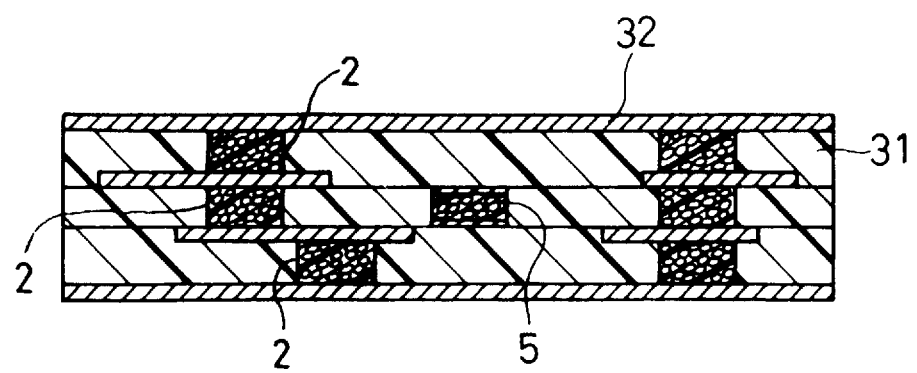

A copper foil is laminated on the outer sides (upper and lower faces) of a four-layer plate. The copper foil is etched to form an inner-through-hole connecting portion in which a wiring pattern and an electrode pattern having a diameter of 0.2 mm are formed. Consequently, a multilayer board having a structure shown in FIG. 4 is formed.

Figure 9:
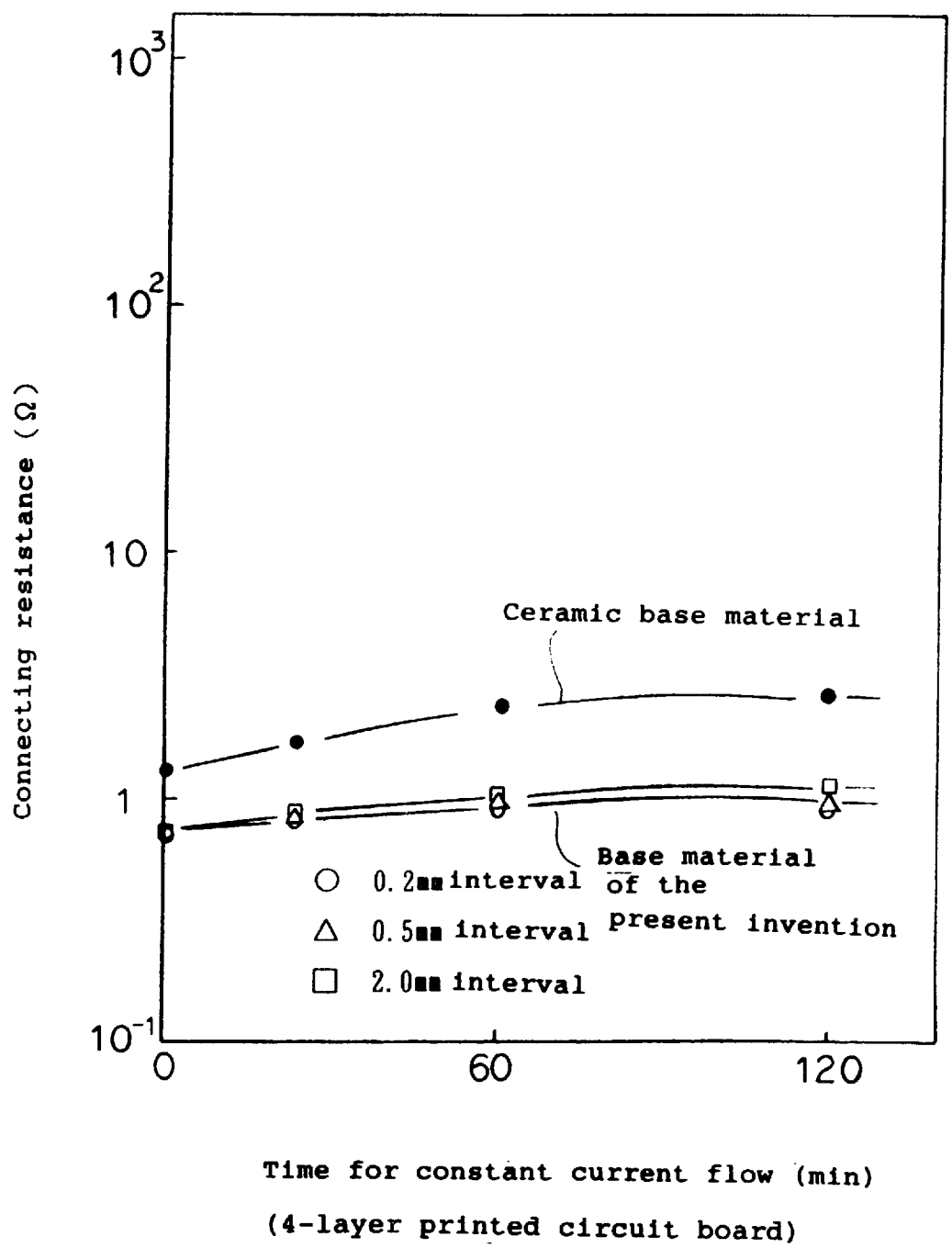
FIG. 9 is a graph showing the change in resistance obtained by sending a constant current to the semiconductor chip mounted on a four-layer board so as to generate heat according to Example 2 of the present invention.

FIG. 9 shows the change in connecting resistance obtained when a semiconductor device having a resistor is mounted on a board, a constant current is sent and the heat of 1W is continuously generated in the same manner as in Example 1. According to the multilayer board of the present example, a copper foil pattern is formed on the inner layer so that the heat conductivity is much better than that of the double board of Example 1 and the change in resistance is seldom observed when generating heat.

(Example 3)

An aramid-epoxy sheet (TA-01 manufactured by Teijin Limited) having a thickness of 200 μm is used as a prepreg. A polyethylene terephthalate film having a thickness of 20 μm is laminated as a cover film onto one of the sides of the prepreg with an adhesive. A through hole having a diameter of 0.15 mm is formed at regular intervals of 0.2 to 2 mm by means of carbon dioxide laser beams.

The following materials are filled in the 90% of the through holes by the screen printing method. As a paste for through hole filling, spherical copper particles 85% by weight, a bisphenol A-type epoxy resin (EPICOAT 828 manufactured by Yuka Shell Epoxy Co., Ltd.) 3% by weight and a glycidylester based epoxy resin (YD-171 manufactured by Tohto Kasei Co., Ltd.) 9% by weight as resin compositions, and an amine adduct hardening agent (MY-24 manufactured by Ajinomoto Co., Inc.) 3% by weight as a hardening agent are kneaded by a triple roll.

The following materials are filled in the 10% of the through holes having no electrically conductive paste filled therein by the screen printing method. As a paste for through hole filling, spherical alumina 40% by weight, a bisphenol A-type epoxy resin (EPICOAT 828 manufactured by Yuka Shell Epoxy Co., Ltd.) 10% by weight and a glycidylester based epoxy resin (YD-171 manufactured by Tohto Kasei Co., Ltd.) 40% by weight as resin compositions, and an amine adduct hardening agent (MY-24 manufactured by Ajinomoto Co., Inc.) 10% by weight as a hardening agent are kneaded by a triple roll.

A polyethylene terephthalate film is removed from the prepreg in which the paste is filled. Then, three prepregs are aligned and stacked to make a layered product. A copper foil having a thickness of 18 μm is laminated on the outer sides of the prepreg on the upper and lower layers of the layered product, and heated and pressed at a temperature of 180° C. and a pressure of 50 kg/cm² for 60 min by means of a heat press to form a double-sided copper-clad plate.

The copper foil of the double-sided copper-clad plate is etched to obtain a double board having a structure shown in FIGS. 10 and 11 in which an inner-through-hole connecting portion (an electrically conductive portion) that has a wiring pattern and an electrode pattern having a diameter of 0.2 mm formed on the inner-through-hole, a thermally conductive portion having only the inner-through-holes, and a thermally conductive portion in which an electrical insulating paste is filled in a through hole.

Figure 16:
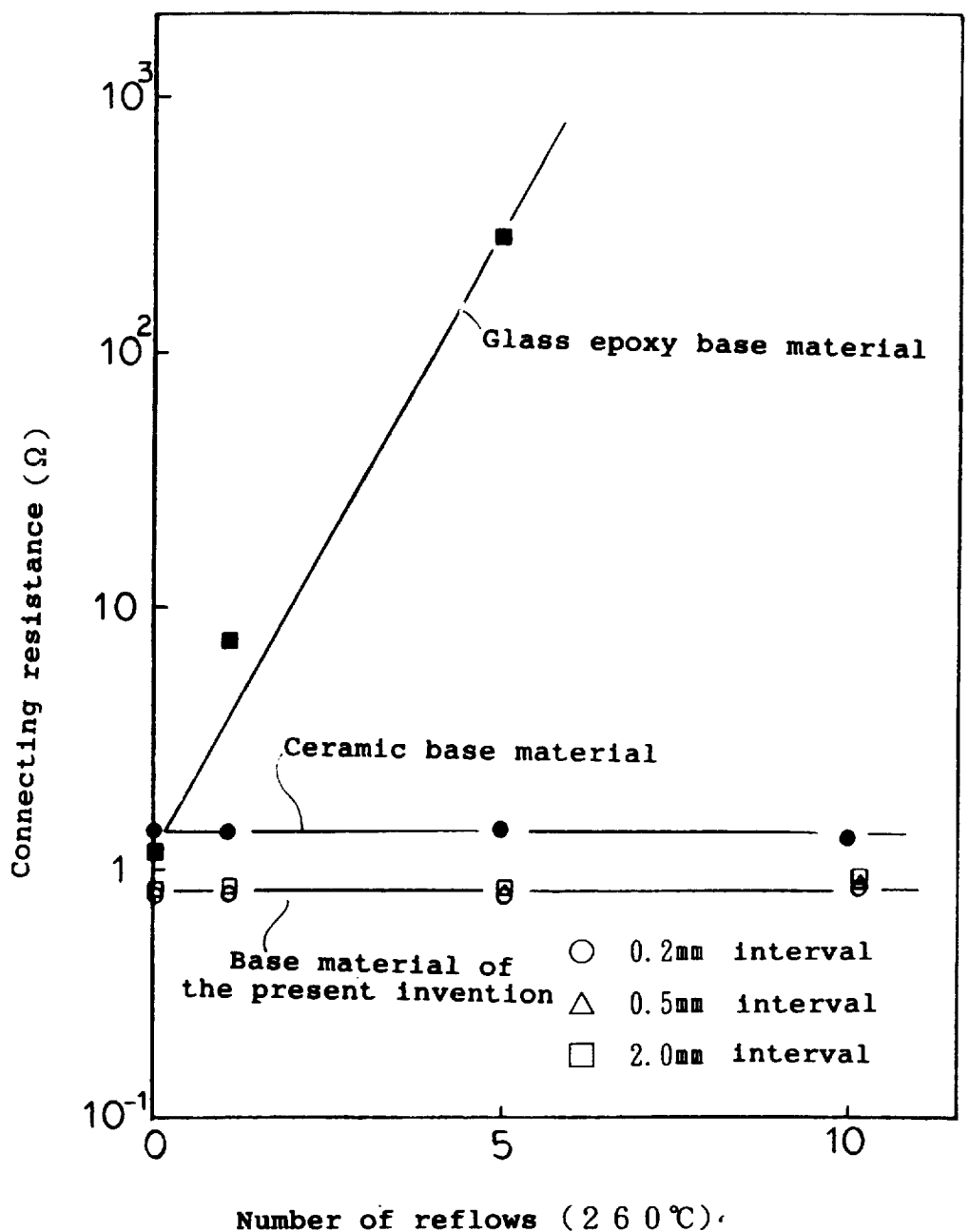
FIG. 16 is a graph showing the change in resistance obtained by the reflow test of the double-sided printed circuit board having a semiconductor chip mounted thereon according to Example 3 of the present invention.

An Au bump is formed on the electrode of a semiconductor device by the known wire bonding method. An adhesive which contains Ag—Pd as an electrically conductive material is applied onto the top portion of the bump. Thus, the bump is bonded to an electrode formed on a board pattern by the flip chip method in which the surface of the semiconductor device is overturned, and is hardened and molded by a resin for mounting. The board to which the semiconductor is mounted is subjected to a reflow test at a maximum temperature of 260° C. for 10 sec. FIG. 16 shows the change of a resistance, which includes the connection of the board to the semiconductor.

According to a conventional glass epoxy board on which through holes are formed at regular intervals of 2 mm, the coefficient of thermal expansion of the semiconductor is different from that of the board, so that the resistance is increased at the junction of the semiconductor and the board. Consequently, a disconnection is caused by the tenth time. According to the board of the present embodiment in which the coefficient of thermal expansion of the board in the direction of a plane is close to that of the semiconductor, no change in resistance caused by the number of reflows is observed.

Figure 17:
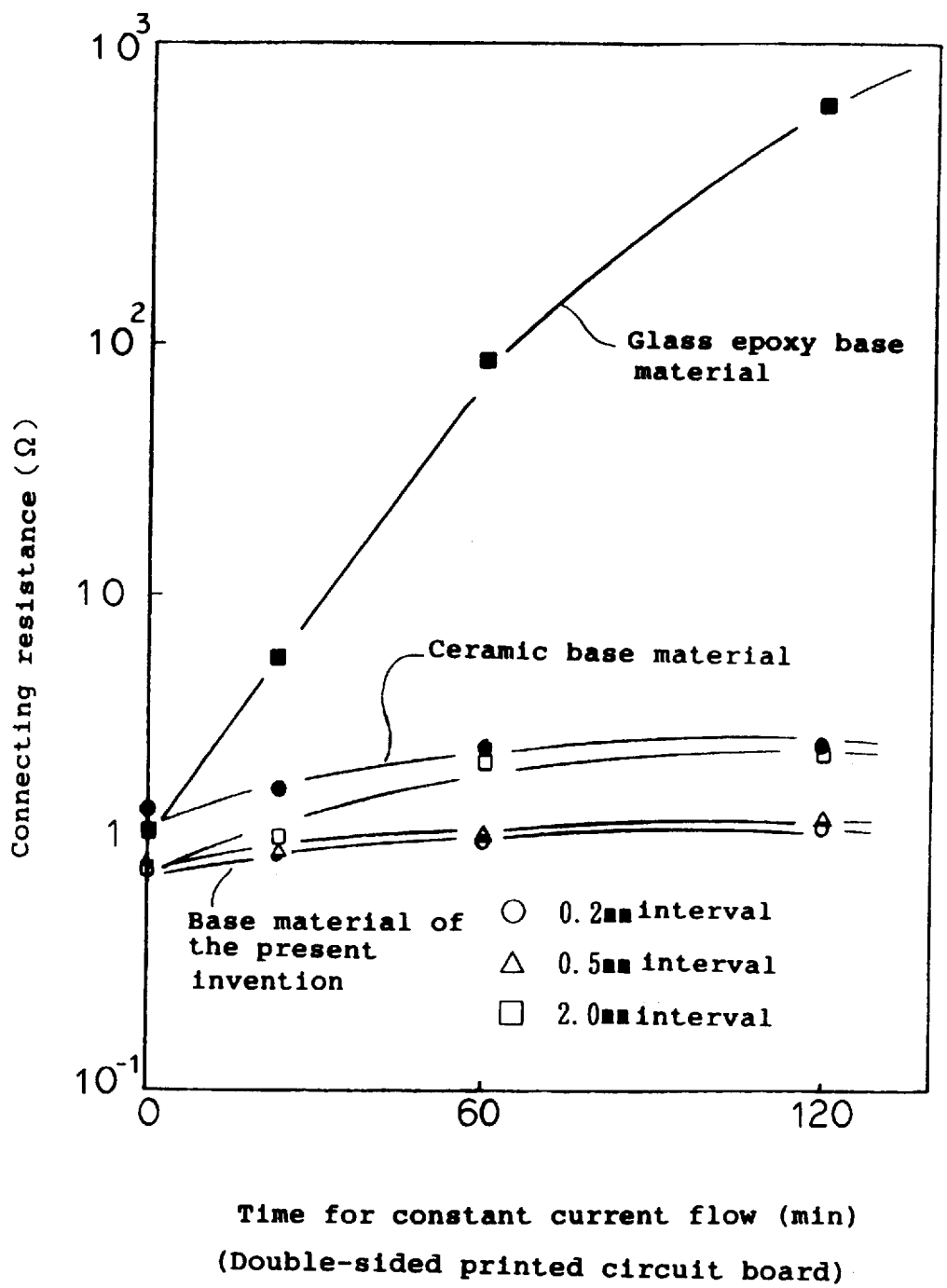
FIG. 17 is a graph showing the change in resistance obtained by sending a constant current to the semiconductor chip mounted on the double-sided printed circuit board so as to generate heat according to Example 3 of the present invention.

FIG. 17 shows the change in resistance which includes the connection of the board to the semiconductor wherein a resistor is formed in a semiconductor chip, a constant current is sent to the chip through the board of the present embodiment, and the heat of 1 W is continuously generated.

The resistance of a glass epoxy board having a small heat conductivity is increased. According to the board of the present embodiment, the resistance is changed depending on the number of inner-through-holes. Practically, the change in resistance is not considered if the spacing is less than 2 mm. In particular, if the spacing is less than 0.5 mm, no change in resistance is observed.

(Example 4)

An aramid-epoxy sheet (TA-01 manufactured by Teijin Limited) is used as a prepreg. A polyethylene terephthalate film having a thickness of 20 μm is laminated onto one of the sides of the prepreg with an adhesive. A through hole having a diameter of 0.15 mm is formed at regular intervals of 0.2 to 2 mm shown in FIG. 15 by means of carbon dioxide laser beams.

The following materials are filled in the 90% of the through holes by the screen printing method. As a paste for via hole filling, spherical copper particles 85% by weight, a bisphenol A-type epoxy resin (EPICOAT 828 manufactured by Yuka Shell Epoxy Co., Ltd.) 3% by weight and a glycidylester based epoxy resin (YD-171 manufactured by Tohto Kasei Co., Ltd.) 9% by weight as resin compositions, and an amine adduct hardening agent (MY-24 manufactured by Ajinomoto Co., Inc.) 3% by weight as a hardening agent are kneaded by a triple roll.

The following materials are filled in the 10% of the through holes having no electrically conductive paste filled therein by the screen printing method. As a paste for through hole filling, spherical alumina 40% by weight, a bisphenol A-type epoxy resin (EPICOAT 828 manufactured by Yuka Shell Epoxy Co., Ltd.) 10% by weight and a glycidylester based epoxy resin (YD-171 manufactured by Tohto Kasei Co., Ltd.) 40% by weight as resin compositions, and an amine adduct hardening agent (MY-24 manufactured by Ajinomoto Co., Inc.) 10% by weight as a hardening agent are kneaded by a triple roll.

A polyethylene terephthalate film is removed from the prepreg in which the paste is filled. Then, a copper foil having a thickness of 18 μm is laminated on the upper and lower faces of the prepreg, and heated and pressed at a temperature of 180° C. and a pressure of 50 kg/cm² for 60 min by means of a heat press to form a double-sided copper-clad plate.

The copper foil of the double-sided copper-clad plate is etched to obtain a double board having a structure in which an inner-through-hole connecting portion (an electrically conductive portion) that has a wiring pattern and an electrode pattern having a diameter of 0.2 mm formed on the inner-through-holes, a thermally conductive portion having only the inner-through-holes, and a thermally conductive portion in which an electrical insulating paste is filled in through holes.

Further, the prepreg in which the electrically conductive paste is filled is aligned and stacked on the upper and lower faces of the double board on which the electrode is formed, so that a layered product is obtained. A copper foil having a thickness of 18 μm is laminated on the outer sides of the layered product, and heated and pressed at a temperature of 180° C. and a pressure of 50 kg/cm² for 60 min by means of a heat press.

A copper foil is laminated on the outer sides (upper and lower faces) of a four-layer plate. The copper foil is etched to form an inner-through-hole connecting portion (an electrically conductive portion) on which a wiring pattern and an electrode pattern having a diameter of 0.2 mm formed on the inner-through-holes. Consequently, a multi-layer board having a structure shown in FIG. 13 is formed.

No change is observed in the connecting resistance obtained when a semiconductor device having a resistor is mounted on a board, a constant current is sent and the heat of 1 W is continuously generated in the same manner as in Example 1. According to the multilayer board of the present example, a copper foil pattern is formed on the inner layer so that the heat conductivity is much better than that of the double board of Example 3 and a change in resistance is seldom observed when generating heat.

While copper particles are used in Examples 1 to 4, the electrically conductive particles are not restricted to the copper particles but other metallic particles can be used in the present invention. In particular, if at least one of Au, Ag, Cu, Al, Pd, Ni and alloys thereof is used, the conductivity of the electrically conductive portion can be enhanced.

While the alumina particles are used as the electrical insulating particles in Examples 1 to 4, the electrical insulating particles are not restricted to the alumina particles but other ceramic particles can be used in the present invention. In particular, if at least one of the alumina particles, silica particles and magnesia particles is used, the electrical insulating properties of the thermally conductive portion can be suitably maintained.

The invention may be embodied in other forms without departing from the spirit or essential characteristics thereof.

The embodiments disclosed in this application are to be considered in all respects as illustrate and not restrictive, the scope of the invention is indicated by the appended claims rather than by the foregoing description, and all changes which come within the meaning and range of equivalency of the claims are intended to be embraced therein.

What is claimed is:

1. A printed circuit board, comprising:
   a resin-impregnated fabric sheet;
   an electrically conductive portion having a first through hole formed in the direction of the thickness of the sheet, the first through hole being filled with a first resin composition that comprises a resin component and electrically conductive particles to provide an electrical connection in the direction of the thickness of the sheet; and
   a thermally conductive portion having a second through hole formed in the direction of the thickness of the sheet, the second through hole being filled with a second resin composition that comprises a resin component and thermally conductive particles,
   wherein at least a portion of the second resin composition is at a surface of the resin-impregnated fabric sheet, and at least the portion of the second resin composition at the surface of the fabric sheet has electrically insulating properties.

2. The printed circuit board according to claim 1, wherein the thermally conductive particles contained in the second resin composition are electrically conductive particles.

3. The printed circuit board according to claim 1, wherein the thermally conductive particles contained in the second resin composition are electrically insulating particles.

4. The printed circuit board according to claim 1, wherein the second through hole is provided with a resin composition that comprises electrically conductive particles and a resin composition that comprises thermally conductive electrically insulating particles, the resin composition that comprises the thermally conductive electrically insulating particles being present at the surface of the resin-impregnated fabric sheet.

5. The printed circuit board according to claim 1, wherein the electrically conductive particles are selected from the group consisting of Au, Ag, Cu, Al, Pd, Ni and alloys thereof.

6. The printed circuit board according to claim 3, wherein the thermally conductive insulating particles are selected from the group consisting of alumina particles, silica particles and magnesia particles.

7. The printed circuit board according to claim 1, wherein the resin-impregnated fabric has a surface layer with an electrically insulating portion, the electrically insulating portion of the surface layer of the sheet being formed of a resin which comprises the resin component of the second resin composition.

8. The printed circuit board according to claim 1, wherein the resin impregnated in the sheet, and the resin components of the first and second resin compositions are thermosetting resins.

9. The printed circuit board according to claim 8, wherein the thermosetting resin is an epoxy resin.

10. The printed circuit board according to claim 1, wherein a metallic foil pattern having a portion that is bonded to the electrically conductive portion is formed on at least one of upper and lower faces of the resin impregnated fabric sheet.

11. The printed circuit board according to claim 1, wherein the fabric sheet is a nonwoven fabric of a heat resistant synthetic fiber or a paper impregnated with the thermosetting resin.

12. The printed circuit board according to claim 11, wherein the fabric sheet is formed of a heat resistant synthetic fiber that is at least one of an aromatic polyamide fiber and a polyimide fiber.

13. The printed circuit board according to claim 1, wherein the first resin composition contains a resin component that is the same as that of the second resin composition.

14. The printed circuit board according to claim 13, wherein the resin component of the first and second resin compositions is the same as the resin used to impregnate the sheet.

15. The printed circuit board according to claim 1, wherein the first and second resin compositions are composed of the same components.

* * * * *